US006277206B1

United States Patent
Freund et al.

(10) Patent No.: US 6,277,206 B1
(45) Date of Patent: Aug. 21, 2001

(54) METHOD FOR UNCLOGGING SOLDER-CLOGGED COLLET USING SOLDER PREFORM

(75) Inventors: Joseph Michael Freund, Fogelsville; George John Przybylek, Douglasville; Dennis Mark Romero, Bethlehem; Mindaugas F. Dautartas, Alburtis, all of PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/366,347

(22) Filed: Aug. 2, 1999

(51) Int. Cl.[7] .............................. B08B 7/00; B08B 9/027
(52) U.S. Cl. ............................ 134/5; 134/19; 134/22.1; 134/22.11; 134/42
(58) Field of Search ..................... 134/5, 19, 22.1, 134/22.11, 42

(56) References Cited

U.S. PATENT DOCUMENTS 4,923,521 * 5/1990 Liu et al. .................................. 134/5

FOREIGN PATENT DOCUMENTS

404277633A * 10/1992 (JP).
409298262 A * 11/1997 (JP).

* cited by examiner

*Primary Examiner*—Zeinab El-Arini
(74) *Attorney, Agent, or Firm*—Dickstein Shapiro Morin & Oshinsky LLP

(57) ABSTRACT

A method for unblocking a vacuum collet channel clogged with solder includes moving a solder-clogged collet into contact with a preform of solder, and melting the solder clog and the preform into a single melted mass, cooling the melted mass to solidify it, and moving the collet away from the cooled mass, leaving the clog behind.

10 Claims, 3 Drawing Sheets

METHOD FOR UNCLOGGING SOLDER-CLOGGED COLLET USING SOLDER PREFORM

FIELD OF THE INVENTION

The present invention relates to the in situ declogging of vacuum collets blocked with solder during semiconductor chip solder bonding operations.

BACKGROUND OF THE INVENTION

Semiconductor laser chips are soldered to optical subassemblies. Often a vacuum collet is used to move the chip into position and hold it there for soldering to the subassembly. The collet is generally moved by a mechanical handler, such as a robotic arm. During use, the vacuum collet may become clogged with solder.

A clogged collet has diminished usefulness, and so the clog must be removed. Conventionally, the collet must be disengaged from the robotic arm, cleaned, and reinstalled. Collets which cannot be cleaned must be replaced.

Various conventional methodologies have been used to clean solder from vacuum collets. For example, a clogged collet may be immersed in an ultra/megasonic bath. Alternatively, high pressure air may be used to attempt to remove the clog. Further, the clog may be dislodged through mechanical means, such as with a fine probe tip.

The conventional methodologies have certain disadvantages. For example, each of the above conventional methods requires that the clogged collet be removed from the handler. This adds time to the processing of the chips. Further, none of the conventional methods are insured of removing all the solder from a clogged collet or solder from every clogged collet. Failure to remove all the solder from a collet prevents that collet from regaining its full work piece holding capability. Failure to remove the clog from the collet also may require replacement of the collet, thus adding to the cost of processing semiconductor chips.

There thus exists a need for a simple apparatus and a method for declogging collets without removing the collets from the processing line.

SUMMARY OF THE INVENTION

The present invention provides a collet declogging apparatus including a collet with a channel and a substrate. During normal use, the channel becomes at least partially blocked by a meltable material, e.g., solder. A preform of the meltable material, e.g., solder is located on the substrate. A heating source is provided for melting the meltable material in the collet and for melting the preform material. The collet is positioned by a collet handler such that the heated meltable material clogging the channel and the preform melted mass join together into a common melted mass. A cooling source then cools the melted mass. The collet is removed by the collet handler from the cooled, and now solidified, material mass free of clogs.

The present invention also provides method of unblocking a collet clogged with solder. The method includes contacting a clogged collet with a preform of solder material, melting the preform and the solder into a single melted mass, cooling the single melted mass into a cooled mass, and moving the collet away from the cooled mass.

These and other features and advantages of the invention will be more clearly understood from the following detailed description of the invention which is provided in connection with the accompanying drawings.

DETAILED DESCRIPTION OF THE PREFERRED EMBODIMENTS

Figure 1:
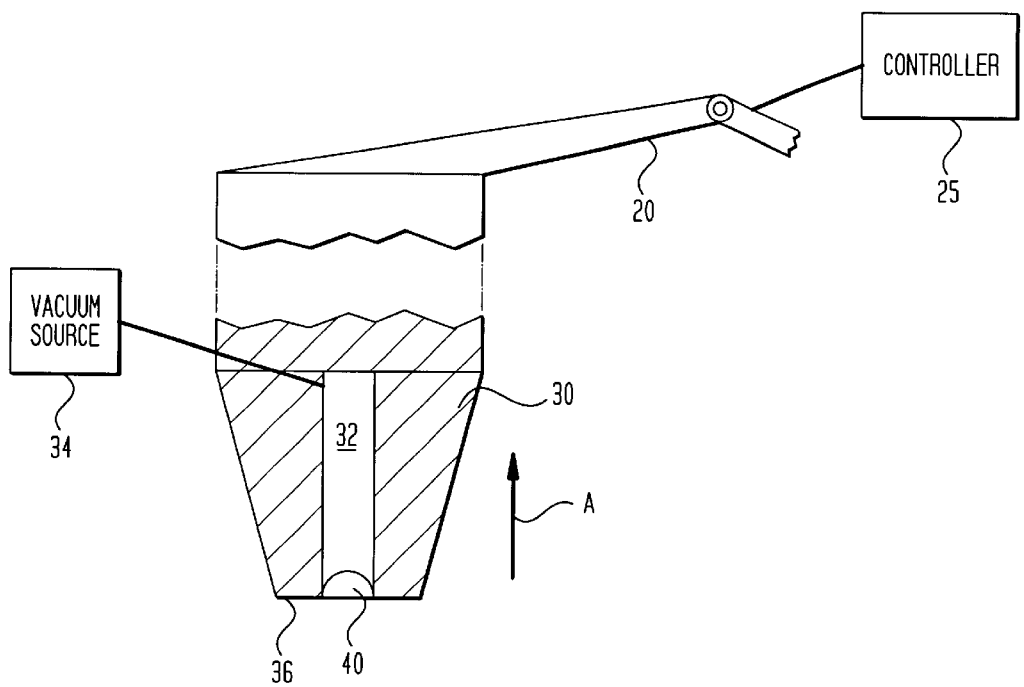
FIG. 1 is a partial cross-sectional view of a vacuum collet and handler used with an embodiment of the invention.

With reference to the drawings, where like numerals designate like elements, there is shown a collet 30 (FIG. 1) including a collet face 36 and a channel 32 sized and configured to receive a vacuum from a vacuum source 34. In operation, a vacuum is drawn by the vacuum source 34 through the channel 32 in the direction of arrow A, such that a semiconductor chip can be temporarily adhered to the collet face 36.

The collet 30 is movable three-dimensionally by way of a handler 20 and a controller 25. The handler 20 is a robotic arm whose movements are controlled by the controller 25. The controller 25, which may be a microprocessor, may be programmed to execute numerous predetermined steps, thereby moving the collet 30 in a specific, predetermined way. The handler 20 may alternatively be a manually controlled device.

In a soldering process, a semiconductor chip is moved into position by the collet 30 and the handler 20, and the chip is soldered to prevent its further movement from that position. Through repeated operation, the collet channel 32 may be partially or totally blocked by a portion of solder clog 40. The collet 30 is preferably formed of a material which is resistant to the adherence of solder, such as, for example, tungsten carbide or stainless steel.

Whether the channel 32 is blocked may be determined by visual or measurement devices. Specifically, one can visually note when the collet 30 fails to pick up a semiconductor chip. Alternatively, one can ascertain from various measurement gauges, such as flowmeters or pressure sensors, which determine or sense vacuum pressure or flow, whether there is a blockage in the collet channel 32.

Figure 2:
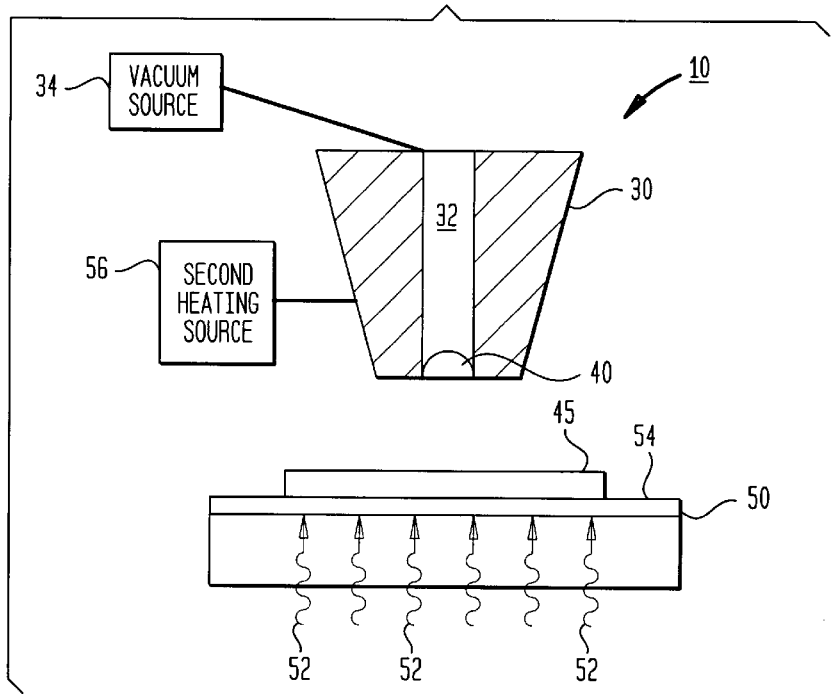
FIG. 2 is a cross-sectional view of the vacuum collet of FIG. 1 and a declogging apparatus constructed in accordance with an embodiment of the invention.

Referring now to FIG. 2, there is shown a substrate 50. After determining that the channel 32 is blocked, a command from the controller 25 moves the handler 20 and the collet 30 over the substrate 50. The substrate 50 includes a heat source 52. Alternatively, the heat source 52 may be separated from, and the heat may be conducted to, the substrate 50.

Located on a top surface 54 of the substrate 50 is a solder preform 45. The preform 45 may take any suitable form. The preform 45 includes a solidified solder material.

Figure 3:
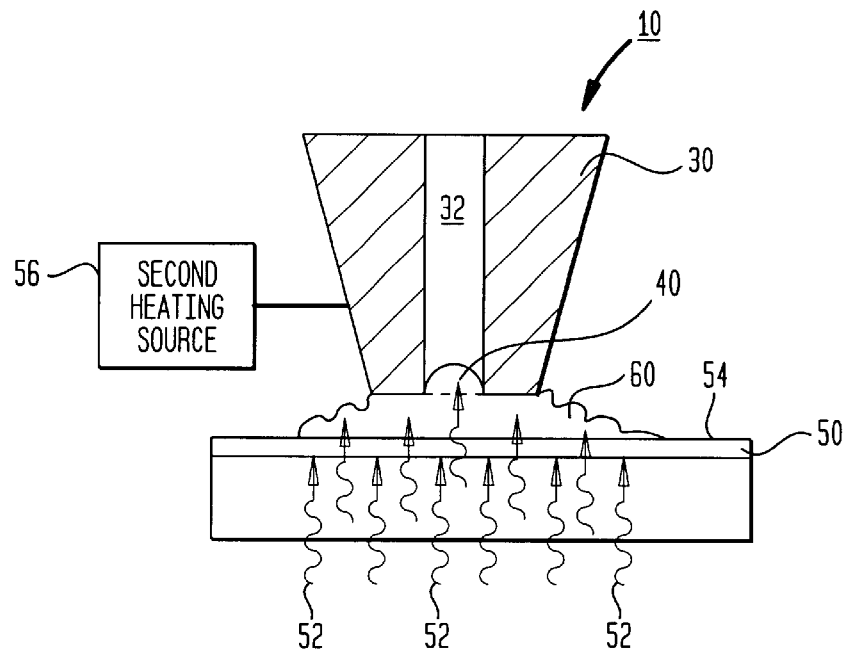
FIG. 3 is another cross-sectional view of the declogging apparatus of FIG. 2 showing melted solder.

Next will be described, with the specific reference to FIGS. 3–6, the method of removing the solder clog 40 from the channel 32. After detecting a clog at step 100, the handler 20 moves the collet 30 above the solder preform 45 at step 102. Then, the controller 25 moves the handler 20 so that the face 36 of the collet 30 contacts the solder preform 45 at step 104. The heat source 52 conducts heat through the substrate 50, at step 106, causing the preform 45 to lose its solid state and become a melted solder mass 60 (FIG. 3). The heat will continue to conduct through the solder mass 60 into the solder clog 40, eventually melting the clog 40.

The preform 45 and solder clog 40 are heated for a sufficient period of time and to a sufficient temperature so as to melt the solder, i.e., up to at least the solder's melting point. The time of heating should be approximately five to ten seconds beyond the time the temperature reaches the solder melting point. It is to be understood, however, that under certain circumstances under five seconds and over ten seconds beyond the time the temperature reaches the solder melting point may be acceptable.

Because the collet 30 is formed of thermally conductive material, it serves as a heat sink, attracting the heat from the heating source 52. To prevent the heat from the heating source 52 being dissipated into the collet 30, a second heating source 56 may be connected to the collet 30. The second heating source 56 serves two functions. One, it assists the heating source 52 in heating the solder clog 40. Two, by heating the collet 30 to within about 20° C. below the solder melting point, the effect of the collet 30 as a heat sink is greatly diminished, allowing the heat from the heating source 52 to more quickly heat the perform 45 and the solder clog 40.

Alternatively, the solder clog 40 and the preform 45 may be heated to a molten state by the second heating source 56 alone. Because the collet 30 is a heat sink, the heat from the second heating source 56 will conduct through the collet 30 toward the channel 32. The solder clog 40 will become melted from the heat generated from the second heating source 56, and will itself conduct heat toward the preform 45. Further heat from the second heating source 56 will be directed to the preform 45 through the collet face 36.

Figure 4:
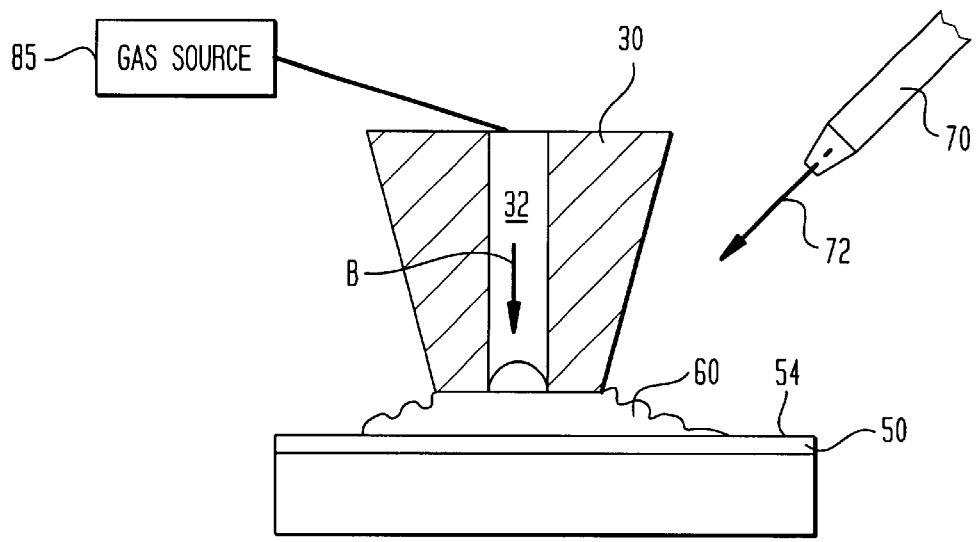
FIG. 4 is another cross-sectional view of the declogging apparatus of FIG. 2 showing solder being solidified.

Due to the contact of the clog 40 and the solder mass 60 and both of their fluid states, the clog 40 wicks together with, that is, integrally joins with, the solder mass 60 (FIG. 4). After a predetermined heating period, a jet sprayer 70 is moved into position near the collet face 36. The sprayer 70 is sized and configured to emit a high pressure jet stream 72. The stream 72 is a fluid stream, such as, for example, high pressure air, nitrogen, argon, carbon dioxide, water, or any other suitable inert gas or liquid.

Figure 5:
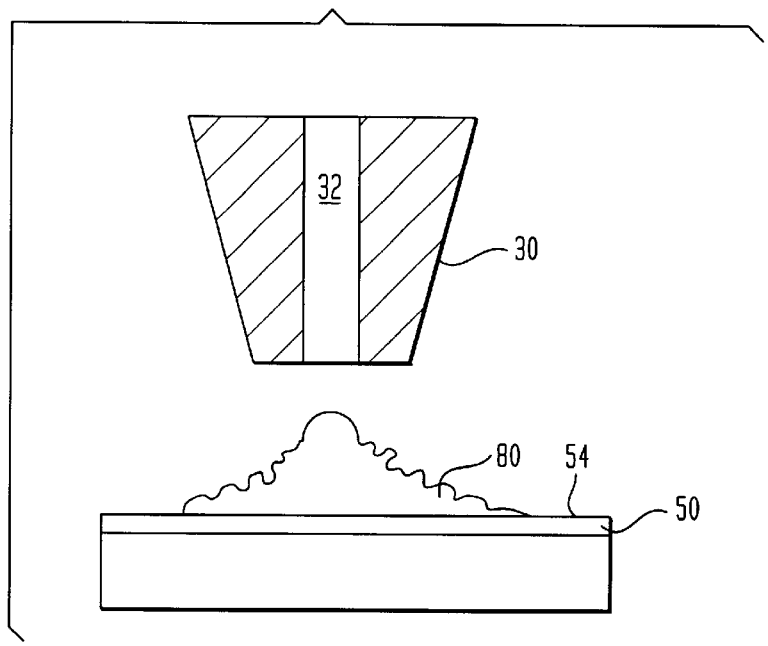
FIG. 5 is another cross-sectional view of the declogging apparatus of FIG. 2 showing an unclogged vacuum collet.
Figure 6:
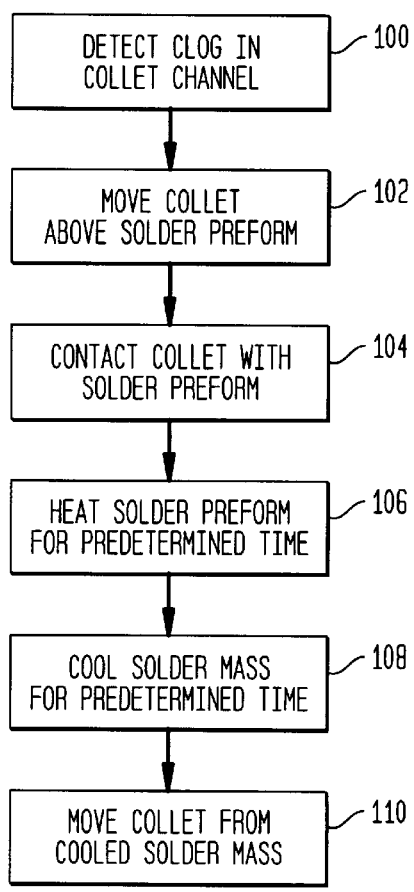
FIG. 6 is a flow diagram of a method for removing a solder clog from a blocked collet channel in accordance with an embodiment of the invention.

The stream 72 serves to cool the melted solder mass 60 down below the solder's melting point at step 108 (FIG. 6). Further, the heating source 52 is typically deactivated to further accelerate the cooling process. The solder mass 60 is solidified by the stream 72 into a cooled solder mass 80 (FIG. 5). The cooling period is determined by the amount of time it takes for the solder to completely solidify, or freeze, into the solder mass 80. One can visually inspect the solidification of the solder into the solder mass 80 to determine when the cooling period can be ended, or a predetermined time period for cooling can be set which is sufficient for solidification of the solder mass 80.

After the cooling period, the collet 30 is moved away at step 110 from the substrate 50 (FIG. 5). Since the collet 30 is formed of a material resistant to wetting, or adherence, by the solder, the collet 30 leaves behind the solidified solder mass 80, thereby declogging the collet channel 32.

To insure that the solder clog 40 exits the channel 32 upon being heated and then cooled into the solidified solder mass 80, a gas source 85 may be connected to the collet channel 32. The gas source 85, when activated, imparts a fluid stream into the channel 32 in the direction of arrow B (FIG. 4), helping to push the solder clog 40 from the channel 32. The gas source 85 may be a unitary device, or alternatively, the gas source 85 may be a reverse switch on the vacuum source 34 enabling the vacuum source to push a fluid stream in the direction of arrow B instead of pulling a fluid stream in the direction of arrow A.

The present invention provides a very simple in situ apparatus and method for efficiently and reliably removing solder from a collet of a pick and place apparatus. The present invention thus saves both processing time and processing costs over conventional collet unclogging techniques.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of unblocking a solder clogged collet comprising the steps of:

contacting a solder clogged collet with a preform of solder material;

melting the preform and the solder clog into a single melted mass;

cooling the single melted mass into a solidified mass; and moving the collet away from the solidified mass.

2. The method of claim 1, wherein the solder clogging the collet is within a collet channel.

3. The method of claim 2, further comprising the step of imparting a fluid stream through the collet channel.

4. The method of claim 1, wherein said contacting and moving steps comprise using a handler to move the collet.

5. The method of claim 4, further comprising controlling movements of the handler.

6. The method of claim 1, wherein said melting step comprises conducting heat through the solder and the preform.

7. The method of claim 6, wherein heat is conducted through said substrate to said preform and solder clogged collet.

8. The method of claim 7, wherein heat is also added directly to the collet.

9. The method of claim 1, wherein said melting step comprises conducting heat through the collet.

10. The method of claim 1, wherein said cooling step comprises spraying a fluid stream toward the single melted mass.

* * * * *